United States Patent [19]

Mueller et al.

[11] Patent Number: 5,010,304

[45] Date of Patent: Apr. 23, 1991

[54] CRYOGENICALLY-COOLED RADIO-FREQUENCY POWER AMPLIFIER

[75] Inventors: Otward M. Mueller, Ballston Lake; William A. Edelstein, Schenectady, both of N.Y.

[73] Assignee: General Electric Company, Schenectady, N.Y.

[21] Appl. No.: 431,361

[22] Filed: Nov. 3, 1989

[51] Int. Cl.$^5$ .......................... H03F 3/26; H03F 3/16
[52] U.S. Cl. ........................................ 330/269; 357/74; 330/277
[58] Field of Search ............... 330/264, 269, 277, 307; 357/74; 455/117, 128

[56] References Cited

U.S. PATENT DOCUMENTS 4,097,814  6/1978  Cohn ............................. 330/269 X
4,590,617  5/1986  Kraemer ........................ 357/74 X

*Primary Examiner*—Steven Mottola
*Attorney, Agent, or Firm*—Marvin Snyder; James C. Davis, Jr.

[57] ABSTRACT

A cryogenically-cooled RF power amplifier utilizes a plurality of metal-oxide-semiconductor field-effect transistors configured on a heat sink having at least one surface in contact with a cryogenic fluid, and having input means for coupling RF driving power into the plurality of cryogenically-cooled MOSFETs and output means for coupling an amplified level of RF power from the cooled MOSFETs to an antenna.

14 Claims, 1 Drawing Sheet

CRYOGENICALLY-COOLED RADIO-FREQUENCY POWER AMPLIFIER

BACKGROUND OF THE INVENTION

The present application relates to solid-state radio-frequency (RF) power amplifiers and, more particularly, to a novel cryogenically-cooled metal-oxide-semiconductor field-effect transistor (MOSFET) power amplifier cooled by liquid nitrogen ($LN_2$) and the like.

Several uses exist for RF power amplifiers which can provide outputs in the 10 KW–100 KW power output range at frequencies on the order of 1–10 MHz. Among such uses are recovery of oil from oil shales and tar sands, in which large potential energy resources exist in an estimated 200 trillion oil barrel equivalents in the U.S. alone. It is necessary to heat the selected oil shale volume (which may be an in-situ mass of size on the order of 20 M×25 M×150 M) to temperatures on the order of 350° C. Such temperatures can be obtained in these volumes by inducing in excess of a megawatt of RF power, in the frequency range 0.5–13.5 MHz, by means of several transmitters each having outputs of about 100 KW. These amplifiers would be operated continuously over several years, so that long life, reliability and high energy conversion efficiency would be mandatory. It is desired to provide high-efficiency cryogenically-cooled RF power amplifiers, utilizing liquid nitrogen-cooled MOSFETs with efficiency levels of at least 98%.

BRIEF SUMMARY OF THE INVENTION

In accordance with the invention, a cryogenically-cooled RF power amplifier utilizes a plurality of metal-oxide-semiconductor field-effect transistors (MOSFETs) configured on a heat sink having at least one surface in contact with a cryogenic fluid, such as liquid nitrogen ($LN_2$) and the like, and having input means for coupling RF driving power into the plurality of cryogenically-cooled MOSFETs and output means for coupling an amplified level of RF power from the cooled MOSFETs to an antenna. Advantageously, the transistors are the cryogenic MOSFET devices described and claimed in co-pending application (RD-19,680), filed Oct., 1989, and incorporated herein in its entirety by reference. The amplifier output devices and at least a portion of the driver devices are mounted on a cryogenically-coolable heat sink assembly to reduce the device drain-source on-resistance ($R_{on,ds}$) by a factor of between 8 and about 30, relative to the $R_{on,ds}$ of the device at room temperature (about 300° K.). Devices having a low temperature switching time reduced by at least a factor of two over the room temperature switching time are used.

In a presently preferred embodiment, several cryogenically-cooled devices are mounted with their substrates forming the sides of an enclosed channel through which the cryogenic cooling fluid is passed.

Accordingly, it is an object of the present invention to provide a novel cryogenically-cooled RF power amplifier assembly.

This and other objects of the present invention will become apparent upon reading the following detailed description, when taken in conjunction with the associated drawings.

DETAILED DESCRIPTION OF THE INVENTION

Figure 1:
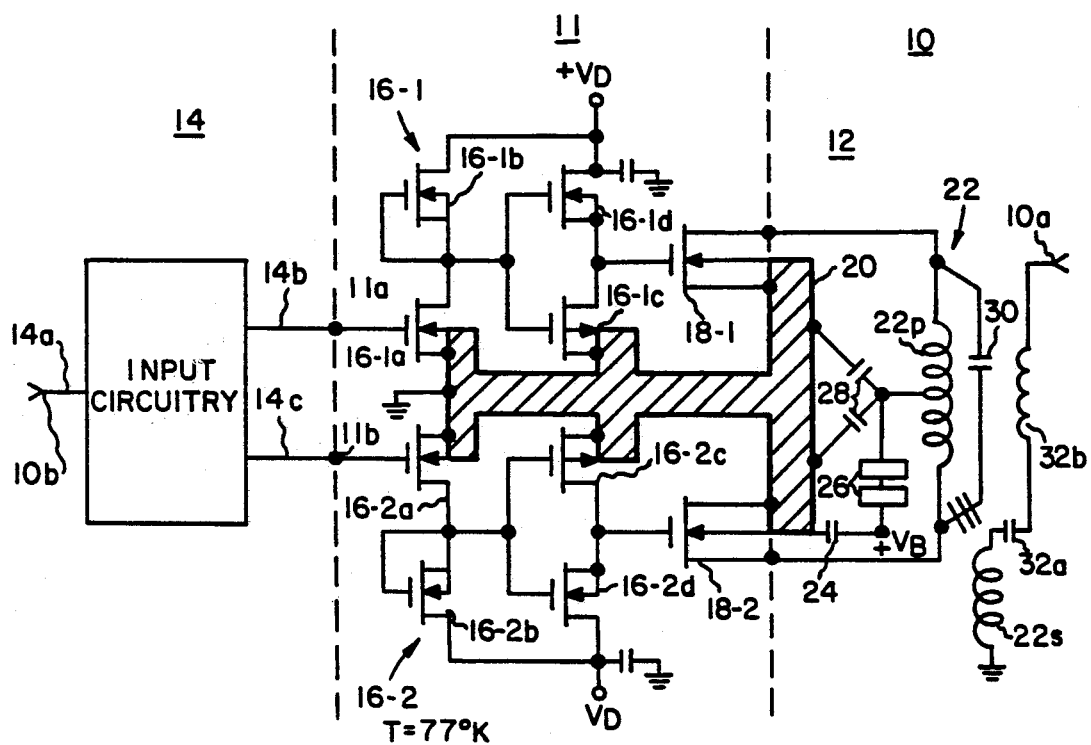
FIG. 1 is a schematic diagram of a cryogenically-cooled MOSFET RF power amplifier, in accordance with the present invention.

Referring initially to FIG. 1, a class D, radio-frequency (RF) amplifier 10 comprises a semiconductor power device subassembly 11, an output circuit subassembly 12 for impedance matching the amplified RF from the cryogenically-cooled device subassembly 11 to an amplifier output 10a, and an input circuit means 14 for impedance matching the input signal at an amplifier input 10b to the devices of subassembly 11. Advantageously, input circuitry 14 receives a single input signal at an input lead 14a and provides a pair of out-of-phase driving signals at outputs 14b and 14c, for respective connection to opposed inputs 11a and 11b of the device subassembly, which contain respective first and second push-pull driver circuits 16-1 and 16-2, each driving one of respective first and second output devices 18-1 and 18-2. Each driver 16-1 or 16-2 contains an input amplifier 16-1a/16-2a, an active load 16-1b/16-2b and a pair of push-pull driver devices 16-1c and 16-1d/16-2c and 16-2d. Those devices (e.g. 16-1a/16-2a, 16-1c/16-2c, 18-1 and 18-2) to be connected to electrical ground potential, are connected to a low-inductance conductive ground bus 20.

Output impedance transformation means 12 includes a transformer means 22 having a primary winding 22p to which the drain electrodes of output SITs or MOSFETs 18-1 and 18-2 are connected, and to which a secondary winding 22s is coupled. Primary winding 22p is advantageously center tapped for connection of a high positive voltage $V_B$, which is filtered through a first filter capacitor 24, several ferrite bead RF choke elements 26 and other bypass capacitors 28. Primary winding 22p is tuned by a tuning capacitor 30. Secondary winding 22s is connected to a series tunable circuit, having a capacitive element 32a and an inductive element 32b, connected to amplifier output 10a. Subassembly 11 is always cryogenically cooled, when the amplifier is in operation, although input means 14 and output means 12 may not be so cooled, dependent upon design goals.

Figure 2:
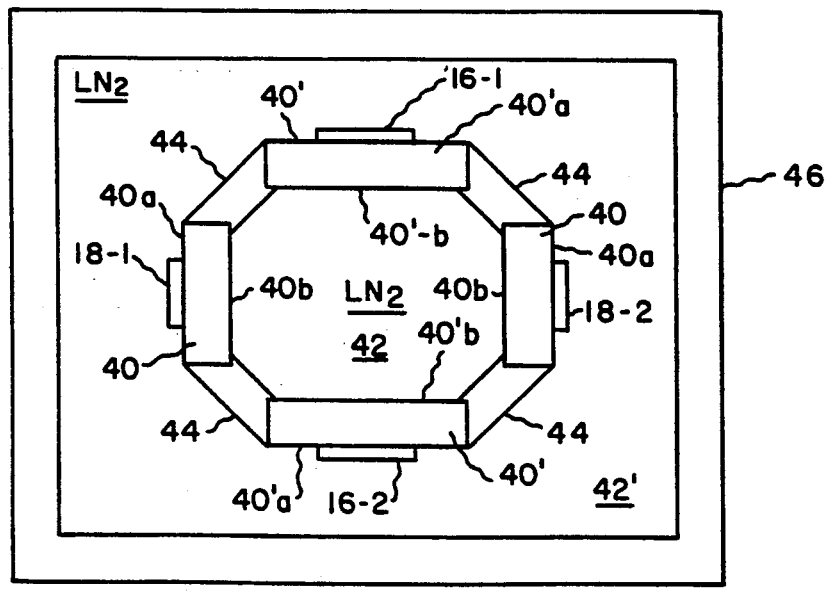
FIG. 2 is a sectional view of the transistor subassembly, illustrating the cryogenic-fluid-containing form thereof.

Referring now to FIG. 2, each output device 18 is mounted upon a first surface 40a of a highly-heat-conductive, but electrically-insulative, substrate 40. Advantageously, where a pair of output devices 18-1 and 18-2 are used, the opposite surfaces 40b of the substrates are substantially parallel, but opposite, to one another, and are arrayed in a vertical plane, so that cryogenic cooling fluid 42, passing thereby, is not able to form a vapor barrier. Other output devices, or driver devices 16, can be mounted upon other first surfaces 40'a of other substrates 40', having their opposite surfaces 40'b substantially parallel to, and spaced from, each other, but at substantially right angles to the surfaces 40b of substrates 40. If all substrates 40 and 40' conduct appreciable thermal energy, the substrates may be positioned vertically, with a vertically-disposed (liquid nitrogen) coolant column 42. Electrically insulative members 44 are advantageously placed between adjacent substrate corners, to completely enclose the interior coolant mass 42. It should be understood that additional coolant mass 42' can be utilized outside of the column, with an external coolantretaining RF shield 46 being utilized if desired.

While several presently preferred embodiments of our novel invention have been described in detail herein, many modifications and variations will now become apparent to those skilled in the art. It will be seen that other amplifier configurations, such as a fullbridge, can be used. It is our intent, therefore, to be limited only by the scope of the appending claims and not by the specific details and instrumentalities presented by way of explanation herein.

What we claim is:

1. A radio-frequency (RF) power amplifier, comprising:
   at least one active solid-state RF power device, having an input impedance and an output impedance;
   input means for matching the input impedance of the at least one active power device to an amplifier input;
   output means for matching the output impedance of the at least one active power device to an amplifier output;
   the at least one power device further comprising active driving means responsive to an RF signal from the input means;
   the power amplifier further comprising substrate means, with high thermal conductivity, for supporting the at least one active power device; and
   cryogenic means, contacting at least the substrate means, for removing thermal energy from the at least one active power device.

2. The amplifier of claim 1, wherein the at least one active power device further comprises a plurality of separate output devices, each mounted upon associated substrate means contacted by the cryogenic means.

3. The amplifier of claim 2, wherein each output device is driven by an associated one of the active driving means.

4. The amplifier of claim 1, wherein each driving means contains at least one active driver circuit.

5. The amplifier of claim 4, wherein at least one of the active driver circuits in each driving means is cryogenically cooled.

6. The amplifier of claim 5, wherein the cryogenic means is a mass of liquid nitrogen.

7. The amplifier of claim 2, wherein each output device is a MOSFET.

8. The amplifier of claim 7, wherein each driving means includes at least one MOSFET.

9. The amplifier of claim 1, wherein the cryogenic means is a mass of liquid nitrogen.

10. The amplifier of claim 2, wherein each of the output devices is a SIT.

11. The amplifier of claim 10, wherein each SIT is made from germanium.

12. The amplifier of claim 11 wherein the SITs are complementary P and N channel devices.

13. The amplifier of claim 1 wherein said input means is cryogenically cooled.

14. The amplifier of claim 1 wherein said output means is cryogenically cooled.

* * * * *